(12) United States Patent
Ikagawa

(10) Patent No.: US 7,226,333 B2
(45) Date of Patent: Jun. 5, 2007

(54) METHOD OF MANUFACTURING AN ORGANIC ELECTROLUMINESCENT DISPLAY DEVICE

(75) Inventor: Masakuni Ikagawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/375,045

(22) Filed: Mar. 15, 2006

(65) Prior Publication Data

US 2006/0159840 A1    Jul. 20, 2006

Related U.S. Application Data

(63) Continuation of application No. 10/662,298, filed on Sep. 16, 2003, now abandoned.

(30) Foreign Application Priority Data

Sep. 27, 2002    (JP) .............................. 2002-284454

(51) Int. Cl.
*H05B 33/00*    (2006.01)
(52) U.S. Cl. ...................................................... 445/24
(58) Field of Classification Search ............. 445/23–25
See application file for complete search history.

(56) References Cited

FOREIGN PATENT DOCUMENTS

| JP | 05-008346 | 1/1993 |
|---|---|---|
| JP | 05-15387 U | 2/1993 |
| JP | 05-335083 | 12/1993 |
| JP | 08-008065 | 1/1996 |
| JP | 11-060911 | 3/1999 |
| JP | 2000-63483 | 2/2000 |
| JP | 2000-164348 | 6/2000 |
| JP | 2001-357973 | 12/2001 |
| JP | 2002-56971 | 2/2002 |

*Primary Examiner*—Joseph Williams
(74) *Attorney, Agent, or Firm*—Pillsbury Winthrop Shaw Pittman, LLP

(57) ABSTRACT

An organic electroluminescent display device includes an array substrate, an organic EL element formed on the array substrate and having a transparent anode, a hole transporting layer, a light emitting layer, and a cathode, an epoxy resin layer so formed as to cover the organic EL element and containing 1 wt % or less of water, and a moisture-resistant layer formed on the epoxy resin layer.

4 Claims, 1 Drawing Sheet

METHOD OF MANUFACTURING AN ORGANIC ELECTROLUMINESCENT DISPLAY DEVICE

CROSS-REFERENCE TO RELATED APPLICATIONS

This application is a continuation of U.S. application Ser. No. 10/662,298, filed Sep. 16, 2003 now abandoned, and for which priority is claimed under 35 U.S.C. §120. This application is based upon and claims the benefit of priority under 35 U.S.C. § 119 from the prior Japanese Patent Application No. 2002-284454, filed, Sep. 27, 2002. The contents of both applications are incorporated herein by reference in their entireties.

BACKGROUND OF THE INVENTION

1. Field of the Invention

The present invention relates to an organic electroluminescent display device (organic EL display device) and, more particularly, to an organic EL display device having an improved organic EL element encapsulating structure.

2. Description of the Related Art

An organic EL element incorporated into an organic EL display device generally has a transparent anode formed on an array substrate, a lattice-like bank formed on this anode to define a plurality of pixel regions, hole transporting layers formed on the anode exposed to these pixel regions, light emitting layers formed on these hole transporting layers so as to be lower than the upper surface of the bank, and made of an organic compound, and a cathode formed on the bank including these light emitting layers.

When this organic EL element is left to stand in the atmosphere, the atmospheric water and oxygen degrade the light emitting layers and cathode, and this degrades the performance of the element. More specifically, a non-light-emitting region called a dark spot is formed, and this dark spot expands with time.

To prevent this, organic EL display devices having various encapsulating structures for protecting the organic EL element from the outside have been researched and developed.

Examples of known techniques are a technique by which an organic EL element is covered and encapsulated with a moisture-resistant layer which is a laminated film obtained by stacking silicon oxide on a polyethyleneterephthalate film, and a technique by which an organic EL element is covered and encapsulated with an organic insulating layer containing silicon oxide or silicon nitride.

Unfortunately, when the moisture-resistant layer made of a laminated film is used, it is difficult to effectively prevent organic EL element degradation caused by water.

Also, when an organic EL element is encapsulated only with the inorganic insulating layer, the productivity lowers or the wear resistance lowers in order to increase the thickness.

Jpn. Pat. Appln. KOKAI Publication No. 2002-056971 describes a method in which a glass, plastic, or metal encapsulating can is filled with a gas such as nitrogen containing barium oxide having a moisture absorbing effect, or with an inert liquid having little influence on an organic EL element, thereby forming an encapsulating layer. However, these encapsulating structures have problems that heat generated when the organic EL display device is driven cannot be well dissipated, i.e., the heat dissipation properties degrade, and the thickness of the organic EL display device itself increases.

It is an object of the present invention to provide an organic EL display device which improves the reliability and durability by suppressing deterioration of an organic EL element for long time periods by stopping external water penetration.

BRIEF SUMMARY OF THE INVENTION

According to an aspect of the present invention, there is provided an organic EL display device comprising:
an array substrate;
an organic EL element formed on the array substrate and having a transparent anode, a hole transporting layer, a light emitting layer, and a cathode;
an epoxy resin layer so formed as to cover the organic EL element and containing 1 wt % or less of water; and
a moisture-resistant layer formed on the epoxy resin layer.

According to another aspect of the present invention, there is provided an organic EL display device comprising:
an array substrate;
an organic EL element formed on the array substrate and having a transparent anode, a hole transporting layer, a light emitting layer, and a cathode;
an inorganic insulating layer so formed as to cover an outer circumferential surface of the organic EL element;
an organic resin layer so formed as to cover at least the organic EL element which is covered with the inorganic insulating layer; and
a moisture-resistant layer formed on the organic resin layer.

According to still another aspect of the present invention, there is provided an organic EL display device comprising:
an array substrate;
an organic EL element formed on the array substrate and having a transparent anode, a hole transporting layer, a light emitting layer, and a cathode,
a first inorganic insulating layer so formed as to cover at least an outer circumferential surface of the organic EL element;
a moisture absorbing layer formed on the first inorganic insulating layer so as to oppose the organic EL element;
a second inorganic insulating layer formed on at least the first inorganic insulating layer so as to cover a surrounding surface of the moisture absorbing layer;
an organic resin layer so formed as to cover at least the organic EL element which is covered with the first and second inorganic insulating layers; and
a moisture-resistant layer formed on the organic resin layer.

DETAILED DESCRIPTION OF THE INVENTION

Embodiments of the present invention will be described in detail below with reference to the accompanying drawing.

(First Embodiment)

Figure 1:
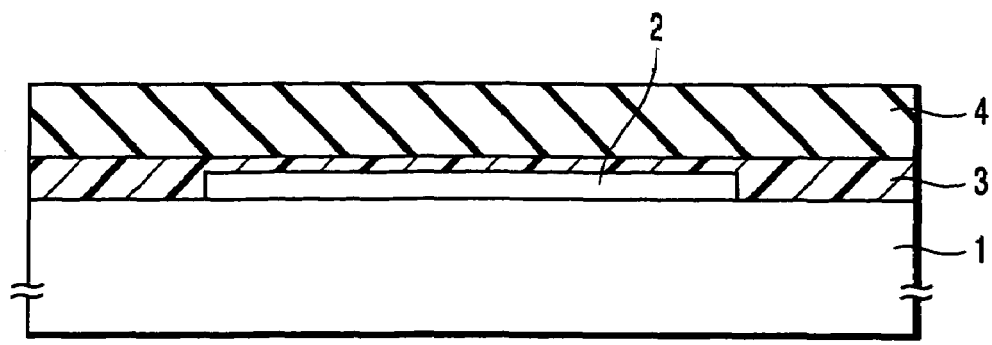
FIG. 1 is a sectional view showing an organic EL display device according to the first embodiment of the present invention.

FIG. 1 is a sectional view showing an organic EL display device according to a first embodiment of the present invention.

An organic EL element 2 is formed on an array substrate 1. Details of the organic EL element 2 are not shown in FIG. 1. For example, the organic EL element 2 has a structure including a transparent anode formed on the array substrate 1, a lattice-like bank formed on this anode to define a plurality of pixel regions, hole transporting layers formed on the anode exposed to these pixel regions, light emitting layers formed on these hole transporting layers so as to be lower than the upper surface of the bank, and made of an organic compound, and a cathode formed on the bank including these light emitting layers.

An epoxy resin layer 3 is formed on the array substrate 1 including the organic EL element 2. The epoxy resin layer 3 contains 1 wt % or less of water. A moisture-resistant layer 4 is formed on the epoxy resin layer 3.

If the water content in the epoxy resin layer exceeds 1 wt %, this may lead to degradation of the light emitting layers forming the organic EL element, corrosion of the cathode, or the like. The water content in the epoxy resin layer is more preferably 0.5 wt % or less.

The epoxy resin layer preferably has a thickness of 1 to 100 µm, and more preferably, 1 to 30 µm, which is larger than that of the organic EL element.

Examples of the moisture-resistant layer are: a laminated film in which one or more layers of at least one inorganic oxide selected from silicon oxide and aluminum oxide are stacked on a base film made of plastic such as polyethyleneterephthalate (PET); a laminated film having a three-layered structure in which a base film made of plastic such as PET is further stacked on the inorganic oxide layer of the laminated film described above; a laminated film in which one or more layers of at least one inorganic nitride selected from silicon nitride and aluminum nitride are stacked on the base film described above; a laminated film having a three-layered structure in which a base film made of plastic such as PET is further stacked on the inorganic nitride layer of the laminated film described above; a laminated film in which a metal such as aluminum, copper, nickel, or stainless steel is deposited on the base film described above; a laminated film having a three-layered structure in which a base film made of plastic such as PET is further stacked on the metal layer of the laminated film described above; and a metal foil made of aluminum, copper, nickel, or stainless steel.

This moisture-resistant layer preferably has a thickness of 50 to 200 µm.

The above organic EL display device is manufactured by, e.g., the following methods.

1) One surface of a moisture-resistant layer is coated with an epoxy resin solution whose water content is reduced to 1 wt % or less by dehydration in advance, thereby forming an epoxy resin solution layer having a desired thickness. Subsequently, an organic EL element is formed on an array substrate, and the moisture-resistant layer having the epoxy resin solution layer is pushed against this array substrate including the organic EL element such that the epoxy resin solution layer is in contact with the array substrate. The epoxy resin solution layer is then thermoset to adhere the moisture-resistant layer via the epoxy resin layer, thereby manufacturing the organic EL display device.

2) After an organic EL element is formed on an array substrate, this array substrate including the organic EL element is coated with an epoxy resin solution whose water content is reduced to 1 wt % or less by dehydration in advance, thereby forming an epoxy resin solution layer having a desired thickness. A moisture-resistant layer is pushed against this epoxy resin solution layer. The epoxy resin solution layer is then thermoset to adhere the moisture-resistant layer via the epoxy resin layer, thereby manufacturing the organic EL display device.

In the first embodiment of the present invention as described above, the epoxy resin layer 3 containing 1 wt % or less of water is formed on the array substrate 1 including the organic EL element 2. That is, the epoxy resin layer 3 is so formed as to cover the organic EL element 2. This prevents water from penetrating into the organic EL element 2 from the outside or from the epoxy resin layer 3 itself. As a consequence, it is possible to prevent degradation of the light emitting layers forming the organic EL element 2, corrosion of the cathode, and the like.

Also, the moisture-resistant layer 4 such as a laminated film in which silicon oxide is stacked on a base film made of plastic is formed on the epoxy resin layer. This makes it possible to prevent external water from penetrating into the organic EL element 2 in the longitudinal direction.

Accordingly, it is possible to obtain an organic EL display device which improves the reliability and durability by suppressing degradation of an organic EL element for long time periods by intercepting external water penetration.

In addition, since the layered structure which intercepts external water can prevent the formation of an air layer, an organic EL display device having good heat dissipation properties can be realized.

Furthermore, the members which intercept external water are the epoxy resin layer 3 and moisture-resistant layer 4, and both the members can be made thin (e.g., the thickness of the epoxy resin layer 3 is 1 to 100 µm, and more preferably, 1 to 30 µm, which is larger than that of the organic EL element 2, and the thickness of the moisture-resistant layer 4 is 50 to 200 µm). Therefore, a thin-film organic EL display device suitable as a display member of a portable telephone can be realized.

(Second Embodiment)

Figure 2:
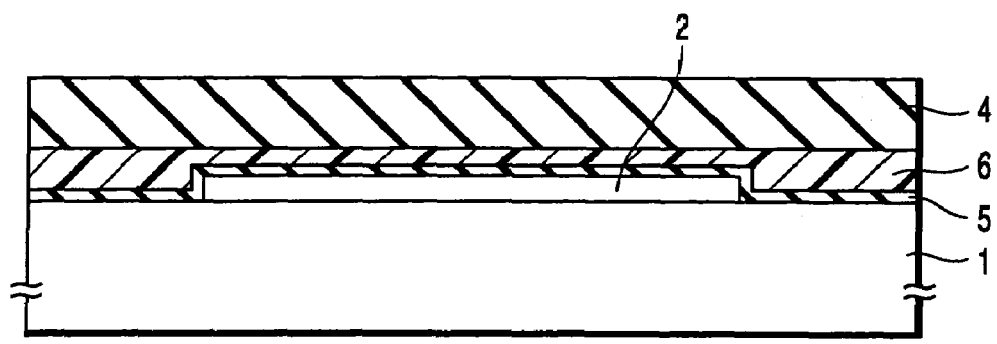
FIG. 2 is a sectional view showing an organic EL display device according to the second embodiment of the present invention.

FIG. 2 is a sectional view showing an organic EL display device according to a second embodiment of the present invention. The same reference numerals as in FIG. 1 of the first embodiment denote the same parts in FIG. 2, and a detailed explanation thereof will be omitted.

An organic EL element 2 having the same structure as in the first embodiment is formed on an array substrate 1. An inorganic insulating layer 5 is formed on the array substrate 1 including the organic EL element 2. An organic resin layer 6 is formed on the inorganic insulating layer 5 so as to have a flat surface. A moisture-resistant layer 4 is formed on the organic resin layer 6.

For example, the inorganic insulating layer is a layer of at least one inorganic oxide selected from silicon oxide and aluminum oxide, or a layer of at least one inorganic nitride selected from silicon nitride and aluminum nitride.

This inorganic insulating layer preferably has a thickness of 0.1 to 5 µm, and more preferably, 0.1 to 3 µm.

The organic resin layer also functions as an adhesive of the moisture-resistant layer, and is made of, e.g., an epoxy-based or acryl-based thermoset resin, or an ultravioletcuring resin. The water content in this organic resin layer is preferably 1 wt % or less, and more preferably, 0.5 wt % or less.

The thickness of that portion of the organic resin layer, which corresponds to the array substrate except for the organic EL element is preferably 1 to 100 µm, and more preferably, 1 to 30 µm, which is larger than that of the organic EL element.

As the moisture-resistant layer, the same laminated film or metal foil as described in the first embodiment can be used.

This moisture-resistant layer preferably has a thickness of 50 to 200 µm.

For example, the above organic EL display device is manufactured by the following methods.

1) One surface of a moisture-resistant layer is coated with an organic resin solution to form an organic resin solution layer having a desired thickness. Subsequently, an organic EL element is formed on an array substrate, and an inorganic insulating layer is formed on this array substrate including the organic EL element by CVD method or sputtering method. The moisture-resistant layer having the organic resin solution layer is pushed against the inorganic insulating layer such that the organic resin solution layer is in contact with the inorganic insulating layer. The organic resin solution layer is then thermoset to adhere the moisture-resistant layer via the organic resin layer, thereby manufacturing the organic EL display device.

2) After an organic EL element is formed on an array substrate, an inorganic insulating layer is formed on this array substrate including the organic EL element by CVD method or sputtering method. Subsequently, the inorganic insulating layer is coated with an organic resin solution to form an organic resin solution layer having a desired thickness. A moisture-resistant layer is pushed against this organic resin solution layer, and the organic resin solution layer is thermoset to adhere the moisture-resistant layer via the organic resin layer, thereby manufacturing the organic EL display device.

In the second embodiment of the present invention as described above, the inorganic insulating layer 5 such as a silicon oxide layer is formed on the array substrate 1 including the organic EL element 2. That is, the inorganic insulating layer 5 is so formed as to cover the organic EL element 2, and the moisture-resistant layer 4 is formed on the inorganic insulating layer 5 via the organic resin layer 6. The moisture-resistant layer 4 prevents external water from penetrating into the organic EL element 2 in the longitudinal direction. In addition, the inorganic insulating layer 5 around the organic EL element 2 more reliably prevents water penetration. This makes it possible to prevent degradation of the light emitting layers forming the organic EL element 2, corrosion of the cathode, and the like. Consequently, it is possible to obtain an organic EL display device which improves reliability and durability by suppressing degradation of an organic EL element for long time periods by intercepting external water penetration.

In addition, since the layered structure which intercepts external water can prevent the formation of an air layer, an organic EL display device having good heat dissipation properties can be realized.

Furthermore, the members which intercept external water are the inorganic insulating layer 5, organic resin layer 6, and moisture-resistant layer 4, and all these members can be made thin (e.g., the thickness of the inorganic insulating layer 5 is 0.1 to 5 µm, and more preferably, 0.1 to 3 µm, the thickness of the thick portion of the organic resin layer 6 is 1 to 100 µm, and more preferably, 1 to 30 µm, and the thickness of the moisture-resistant layer 4 is 50 to 200 µm). Therefore, a thin-film organic EL display device suitable as a display member of a portable telephone can be realized.

Note that if the water content in the organic resin layer is 1 wt % or less, penetration of external water into the organic EL element 2 can be prevented more effectively.

(Third Embodiment)

Figure 3:
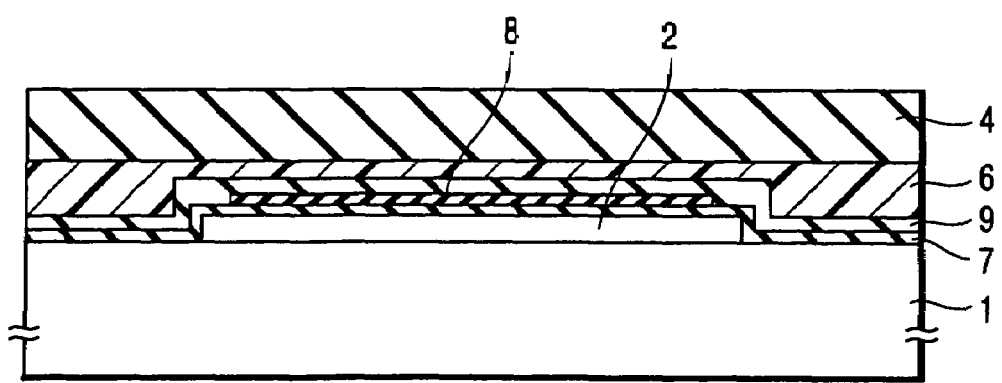
FIG. 3 is a sectional view showing an organic EL display device according to the third embodiment of the present invention.

FIG. 3 is a sectional view showing an organic EL display device according to a third embodiment of the present invention. The same reference numerals as in FIGS. 1 and 2 of the first and second embodiments denote the same parts in FIG. 3, and a detailed explanation thereof will be omitted.

An organic EL element 2 having the same structure as in the first embodiment is formed on an array substrate 1. A first inorganic insulating layer 7 is formed on the array substrate 1 including the organic EL element 2. A moisture absorbing layer 8 is formed on that portion of the first inorganic insulating layer 7, which corresponds to the organic EL element 2. A second inorganic insulating layer 9 is formed on the first inorganic insulating layer 7 including the moisture absorbing layer 8. An organic resin layer 6 is formed on the second inorganic insulating layer 9 so as to have a flat surface. A moisture-resistant layer 4 is formed on the organic resin layer 6.

For example, each of the first and second inorganic insulating layers is a layer of at least one inorganic oxide selected from silicon oxide and aluminum oxide, or a layer of at least one inorganic nitride selected from silicon nitride and aluminum nitride. The first and second inorganic insulating layers can be made of the same material or different materials.

Each of the first and second inorganic insulating layers preferably has a thickness of 0.1 to 5 µm, and more preferably, 0.1 to 3 µm.

The moisture absorbing layer is at least one layer selected from calcium, barium, oxides of calcium and barium, silica gel, and polyvinyl alcohol.

This moisture absorbing layer preferably has a thickness of 0.01 to 0.5 µm.

The organic resin layer can be the same as that in the second embodiment. The water content in this organic resin layer is preferably 1 wt % or less, and more preferably, 0.5 wt % or less.

The thickness of that portion of the organic resin layer, which corresponds to the array substrate except for the organic EL element is favorably 1 to 100 µm, and more preferably, 1 to 30 µm, which is larger than that of the organic EL element.

As the moisture-resistant layer, the same laminated film or metal foil as described in the first embodiment can be used.

This moisture-resistant layer preferably has a thickness of 50 to 200 µm.

For example, the above organic EL display device is manufactured by the following method.

1) One surface of a moisture-resistant layer is coated with an organic resin solution to form an organic resin solution layer having a desired thickness. Subsequently, an organic EL element is formed on an array substrate, and a first inorganic insulating layer is formed on this array substrate including the organic EL element by CVD method or sputtering method. After a moisture absorbing layer is formed by sputtering on that portion of the first inorganic insulating layer which corresponds to the organic EL element, a second inorganic insulating layer is formed on the first inorganic insulating layer including the moisture absorbing layer by CVD method or sputtering method. The moisture-resistant layer having the organic resin solution layer is pushed against the second inorganic insulating layer such that the organic resin solution layer is in contact with the inorganic insulating layer. The organic resin solution layer is then thermoset to adhere the moisture-resistant layer via the organic resin layer, thereby manufacturing the organic EL display device.

2) After an organic EL element is formed on an array substrate, a first inorganic insulating layer is formed on this array substrate including the organic EL element by CVD method or sputtering method. Subsequently, a moisture absorbing layer is formed on that portion of the first inorganic insulating layer, which corresponds to the organic EL element, and a second inorganic insulating layer is formed on the first inorganic insulating layer including the moisture absorbing layer. The second inorganic insulating layer is then coated with an organic resin solution to form an organic resin solution layer having a desired thickness. A moisture-resistant layer is pushed against this organic resin solution layer, and the organic resin solution layer is thermoset to adhere the moisture-resistant layer via the organic resin layer, thereby manufacturing the organic EL display device.

In the third embodiment of the present invention as described above, the first inorganic insulating layer 7 such as a silicon oxide layer is formed on the array substrate 1 including the organic EL element 2. That is, the first inorganic insulating layer 7 is so formed as to cover the organic EL element 2, and the moisture absorbing layer 8 is formed on that portion of the first inorganic insulating layer 7, which corresponds to the organic EL element 2. The second inorganic insulating layer 9 is formed on the first inorganic insulating layer 7 including the moisture absorbing layer 8, and the moisture-resistant layer 4 is formed on the second inorganic insulating layer 9 via the organic resin layer 6. With this structure, the moisture-resistant layer 4 prevents external water from penetrating into the organic EL element 2 in the longitudinal direction. In addition, the first and second inorganic insulating layers 7 and 9 around the organic EL element 2 prevent penetration of external water into the organic EL element 2. Furthermore, the moisture absorbing layer 8 interposed between those portions of the first and second inorganic insulating layers 7 and 9 which correspond to the organic EL element 2 adsorbs and holds the water penetrates into the organic EL element 2 in the longitudinal direction, thereby preventing water penetration into the organic EL element 2. As a consequence, it is possible to prevent degradation of the light emitting layers forming the organic EL element 2, corrosion of the cathode, and the like.

Accordingly, it is possible to obtain an organic EL display device which improves reliability and durability by suppressing degradation of an organic EL element for long time periods by intercepting external water penetration.

In addition, since the layered structure which intercepts external water can prevent the formation of an air layer, an organic EL display device having good heat dissipation properties can be realized.

Furthermore, the members which intercept external water are the first and second inorganic insulating layers 7 and 9, moisture absorbing layer 8, organic resin layer 6, and moisture-resistant layer 4, and all these members can be made thin (e.g., the thickness of each of the first and second inorganic insulating layers 7 and 9 is 0.1 to 5 μm, and more preferably, 0.1 to 3 μm, the thickness of the moisture absorbing layer 8 is 0.01 to 0.5 μm, the thickness of the thick portion of the organic resin layer 6 is 1 to 100 μm, and more preferably, 1 to 30 μm, and the thickness of the moisture-resistant layer 4 is 50 to 200 μm). Therefore, a thin-film organic EL display device suitable as a display member of a portable telephone can be realized.

Note that if the water content in the organic resin layer is 1 wt % or less, penetration of external water into the organic EL element 2 can be prevented more effectively.

EXAMPLES

The present invention will be described in more detail below by way of its examples.

Example 1

The water content of an epoxy resin solution was reduced to 0.5 wt % by dehydration. One surface of a moisture-resistant layer having a three-layered structure in which a 3 μm thick silicon oxide layer was interposed between two PET films was coated with the epoxy resin solution to form a 30 μm thick epoxy resin solution layer.

Subsequently, a 3 μm thick organic EL element was formed on an array substrate, and the moisture-resistant layer having the epoxy resin solution layer was pushed against this array substrate including the organic EL element such that the epoxy resin solution layer was in contact with the array substrate. After that, the epoxy resin solution layer was thermoset at 80° C. to adhere the moisture-resistant layer via the epoxy resin layer, thereby manufacturing an organic EL display device having the structure shown in FIG. 1.

Comparative Example 1

An organic EL display device was manufactured following the same procedure as in Example 1 except that an epoxy resin solution not dehydrated and containing 2 wt % of water was used.

Each of the obtained organic EL display devices of Example 1 and Comparative Example 1 was left to stand in a high ambient temperature of 60° C. and high ambient humidity of 90% RH for 500 hrs. After that, each organic EL display device was caused to emit light by applying a predetermined voltage between the anode and cathode of the organic EL element, and the light emission state was visually checked.

Consequently, no non-light-emitting region called a dark spot was formed in the organic EL display device of Example 1. In contrast, in the organic EL display device of Comparative Example 1, dark spots began to form in the initial stages. After this organic EL display device was left to stand for 500 hrs, dark spots were formed in about 10% of the area.

Example 2

First, one surface of a moisture-resistant layer having a three-layered structure in which a 10 μm thick silicon oxide layer was interposed between two PET films was coated with an epoxy resin solution to form a 30-μm thick epoxy resin solution layer.

Subsequently, a 3 μm thick organic EL element was formed on an array substrate, and a 0.1 μm thick silicon oxide layer (inorganic insulating layer) was formed on this array substrate including the organic EL element by CVD method. The moisture-resistant layer having the epoxy resin solution layer was then pushed against the inorganic insulating layer such that the epoxy resin solution layer was in contact with the inorganic insulting layer. After that, the epoxy resin solution layer was thermoset at 80° C. to adhere the moisture-resistant layer via the epoxy resin layer, thereby manufacturing an organic EL display device having the structure shown in FIG. 2.

The obtained organic EL display device of Example 2 was left to stand in a high ambient temperature of 60° C. and high ambient humidity of 90% RH for 500 hrs the same as Example 1. After that, the organic EL display device was caused to emit light by applying a predetermined voltage between the anode and cathode of the organic EL element, and the light emission state was visually checked. As a consequence, no non-light-emitting region called a dark spot was formed.

Example 3

First, one surface of a moisture-resistant layer having a three-layered structure in which a 3 μm thick silicon oxide layer was interposed between two PET films was coated with an epoxy resin solution to form a 10 μm thick epoxy resin solution layer.

Subsequently, a 3 μm thick organic EL element was formed on an array substrate, and a 0.1 μm thick silicon oxide layer (first inorganic insulating layer) was formed on this array substrate including the organic EL element by CVD method. A 0.1 μm thick moisture absorbing layer made of calcium oxide was formed by sputtering on that portion of the first inorganic insulating layer, which corresponded to the organic EL element. After that, a 0.1 μm thick silicon oxide layer (second inorganic insulating layer) was formed on the first inorganic insulating layer including the moisture absorbing layer by CVD method. The moisture-resistant layer having the epoxy resin solution layer was pushed against the second inorganic insulating layer such that the epoxy resin solution layer was in contact with the second inorganic insulting layer. Then, the epoxy resin solution layer was thermoset at 80° C. to adhere the moisture-resistant layer via the epoxy resin layer, thereby manufacturing an organic EL display device having the structure shown in FIG. 3.

The obtained organic EL display device of Example 3 was left to stand in a high ambient temperature of 60° C. and high ambient humidity of 90% RH for 500 hrs the same as Example 1. After that, the organic EL display device was caused to emit light by applying a predetermined voltage between the anode and cathode of the organic EL element, and the light emission state was visually checked. As a consequence, no non-light-emitting region called a dark spot was formed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing an organic electroluminescent display device comprising:

forming an organic electroluminescent element, which has a transparent anode, a hole transporting layer, a light emitting layer, and a cathode on an array substrate;

coating the array substrate including the organic electroluminescent element with an epoxy resin solution whose water content is reduced to 1 wt % or less by dehydration in advance, thereby forming an epoxy resin solution layer forming a moisture-resistant layer on the epoxy resin solution layer; and curing the epoxy resin solution layer to form an epoxy resin layer containing not more than 1 wt % of water, thereby adhering the moisture-resistant layer with the epoxy resin layer.

2. A method according to claim 1, wherein the moisture-resistant layer is a laminated film in which not less than one layer of at least one inorganic oxide selected from the group consisting of silicon oxide and aluminum oxide, or at least one inorganic nitride selected from the group consisting of silicon nitride and aluminum nitride, is stacked on a base film made of plastic, a laminated film formed by depositing a metal on a base film made of plastic, or a metal foil.

3. A method according to claim 2, wherein the moisture-resistant layer has a three-layered structure in which a silicon oxide layer is interposed between two base films.

4. A method according to claim 1, wherein the moisture-resistant film has a thickness of 50 to 200 μm.

* * * * *